(12) United States Patent
Shiokawa

(10) Patent No.: US 6,316,052 B1
(45) Date of Patent: Nov. 13, 2001

(54) METHOD FOR THE SURFACE TREATMENT OF VACUUM MATERIALS AND SURFACE TREATED VACUUM

(75) Inventor: Yoshiro Shiokawa, Tokyo (JP)

(73) Assignee: Anelva Corporation, Tokyo (JP)

( * ) Notice: Subject to any disclaimer, the term of this patent is extended or adjusted under 35 U.S.C. 154(b) by 0 days.

(21) Appl. No.: 09/460,725

(22) Filed: Dec. 14, 1999

Related U.S. Application Data

(63) Continuation-in-part of application No. 09/322,162, filed on May 28, 1999.

(30) Foreign Application Priority Data

Aug. 19, 1998 (JP) .................................................. 10-249219
Aug. 10, 1999 (JP) .................................................. 11-226934

(51) Int. Cl.$^7$ ...................................................... B05D 7/22
(52) U.S. Cl. ...................... 427/237; 427/230; 427/256; 118/715
(58) Field of Search ............................ 427/248.1, 255.11, 427/255.18, 255.21, 255.28, 255.37, 256, 287, 237, 230; 438/942; 118/715, 720

(56) References Cited

U.S. PATENT DOCUMENTS

| | | | |
|---|---|---|---|
| 4,099,990 | * | 7/1978 | Brown et al. ........................ 148/6.35 |
| 5,208,069 | * | 5/1993 | Clark et al. ............................ 427/226 |
| 5,413,813 | * | 5/1995 | Cruse et al. .......................... 427/237 |
| 5,830,532 | * | 11/1998 | Tang et al. ............................ 427/255 |
| 6,022,586 | * | 2/2000 | Hashimoto et al. .................. 427/237 |
| 6,054,206 | * | 4/2000 | Mountsier ........................ 428/312.8 |

FOREIGN PATENT DOCUMENTS

| | | |
|---|---|---|
| 04-263011 | 9/1992 | (JP) . |
| 04-337074 | 11/1992 | (JP) . |
| 06-041629 | 2/1994 | (JP) . |
| 06-116632 | 4/1994 | (JP) . |
| 06-207275 | 7/1994 | (JP) . |
| 07-062431 | 3/1995 | (JP) . |
| 09-091606 | 4/1997 | (JP) . |

OTHER PUBLICATIONS

Y. Kurokawa et al.; "Sticking Probability of Water Molecules on the Internal Surface of a Vacuum Chamber Made of Stainless Steel"; Journal of the Vacuum Society of Japan, vol. 37, No. 2 (1994)—English Abstract Only.

T. Tanaka et al.; "Sticking Probability of Water Molecules on the Internal Surface of a Vacuum Chamber: Effects of Surface Treatments"; Journal of the Vacuum Society of Japan, vol. 38, No. 9 (1995)—English Abstract Only.

Y. Tuzi et al.; "Adsorption of Water Molecules in a Vacuum Chamber Made of Stainless Steel: Study Through the Measurement of Sticking Probability"; Journal of the Vacuum Society of Japan, vol. 40, No. 4 (1997)—English Abstract Only.

Y. Tuzi et al; "Effect of Bake–out on the Adsorption Kinetics of Gases in a Vacuum Chamber"; Vacuum, vol. 44, Nos. 5–7, pp. 447 to 449 (1993).

(List continued on next page.)

*Primary Examiner*—Shrive P. Beck
*Assistant Examiner*—Wesley Markham
(74) *Attorney, Agent, or Firm*—Burns, Doane, Swecker & Mathis, LLP

(57) ABSTRACT

A method for the surface treatment of vacuum materials reduces the $H_2O$ sticking probability on the surface of the vacuum material. The $H_2O$ sticking probability is reduced by selectively depositing silicon oxide, for example, and covering the regions which are in an active state on the surface of the vacuum material, and by setting the coverage to less than 100% of the state where film formation is achieved. If the abovementioned coverage is within the range from 40 to 80%, then it is possible to reduce the $H_2O$ sticking probability to a minimum.

24 Claims, 5 Drawing Sheets

OTHER PUBLICATIONS

Y. Tuzi et al; "Effect of Surface Treatment on the Adsorption Kinetics of Water Vapor in a Vacuum Chamber"; Vacuum, vol. 47, Nos. 6–8, pp. 705 to 708 (1996).

S. Inayoshi et al.; "Decrease of Water Vapor Desorption by Si Film Coating on Stainless Steel"; Vacuum, vol. 53, pp. 281–284 (1999).

S. Inayoshi et al.; "Outgassing Properties of a Si Film on Stainless Steel; The 45 $^{th}$ Applied Physics Association Lecture Meeting"; Mar. 1998, 29p–x–7—English Abstract Only.

A. Ohki et al.; "The Moisture Adsorption and Desorption to the Surface of Si and SiO2"; Ultraclean Technology, vol. 3, pp. 268–277 (1991)—English Abstract Only.

Y. Shiokawa et al.; "Water in Vacuum Apparatus"; Japanese Vacuum Technology Association Regulating Meeting, Jun. 1998.

Y. Shiokawa et al.; "Application of Molecular Beam Method to Surface Reaction Study"; JRCAT International Symposium on Atom Technology, Komaba Eminence, Tokyo, Jan. 30 and 31, 1997, pp. 77–80.

Y. Shiokawa et al.; "Measurement and Control of the Sticking Probability of $H_2O$ on Stainless Steel Surfaces"; $5^{th}$ JRCAT International Symposium on Atom Technology, Komaba Eminence, Tokyo, Nov. 26, 1997, pp. 31–34.

Y. Shiokawa et al.; "Measurement and Control of the Sticking Probability of $H_2O$ on Stainless Steel Surfaces"; Journal of Vacuum Science & Technology A, vol. 16, No. 3, Part 1, May/Jun. 1998, pp. 1131–1136.

Abstract Book; "Sticking Probabilities of Water on SUS304 Surfaces Treated By Various Methods", Y.S. Shiokawa et al.; $14^{th}$ International Vacuum Congress (IVC–14): $10^{th}$ International Conference on Solid Surfaces (ICSS–10); $5^{th}$ International Conference on Nanometer–scale Science and Technology (NANO 5); $10^{th}$ International Conference on Quantitative Surface Analysis (QSA–10); International Convention Centre, Aug. 31–Sep. 4, 1998, p. 418.

Abstracts; "VT–TuP1 Measurement and Control of Sticking Probability of $H_2O$ on Stainless Steel Surfaces", by Y. Shiokawa et al.; $44^{th}$ National Symposium, Oct. 22–24, 1997, pp. 130–131.

* cited by examiner

METHOD FOR THE SURFACE TREATMENT OF VACUUM MATERIALS AND SURFACE TREATED VACUUM

CROSS-REFERENCE TO RELATED APPLICATIONS

This application corresponds to Japanese Patent Application Nos. 10-249219 and 11-226934, filed in Japan on Aug. 19, 1998 and Aug. 10, 1999, respectively, the entire contents of which are hereby incorporated herein by reference. This application is a continuation-in-part of U.S. Ser. no. 09/322,162, filed on May 28, 1999, the entire contents of which are hereby incorporated herein by reference.

BACKGROUND OF THE INVENTION

1. Field of the Invention

The present invention, relates to a method for the surface treatment of vacuum materials, and more particularly, it relates to a method for the surface treatment of vacuum materials which are used, for example, in vacuum apparatus for thin film deposition purposes in which semiconductors and electronic parts are produced.

2. Description of Related Art

In the past, it has been necessary with vacuum materials such as stainless steel which are used in vacuum apparatuses for thin film processing purposes, for example, to reduce the amount of gas which is released from the surface of the materials and to reduce the gas sticking probability of the surface. Water ($H_2O$) which is always present and which has a strong oxidizing action is especially important as such a gas. A surface treatment which can reduce the "amount of $H_2O$ released" and reduce the "$H_2O$ sticking probability" is very desirable. The "amount of $H_2O$ released" signifies the amount of water which is released from the surface into the space when a vacuum material which has been present in an environment at atmospheric pressure is pumped out to a vacuum environment. On the other hand, the "$H_2O$ sticking probability" signifies the proportion of the $H_2O$ which does not rebound, but rather sticks to the surface of the vacuum material when $H_2O$ is colliding with the surface of the vacuum material in the vacuum environment.

The units of the "$H_2O$ sticking probability" reflect the number of $H_2O$ molecules that will stick. For example, an "$H_2O$ sticking probability" of $2 \times 10^{-3}$ means that two $H_2O$ molecules out of each one thousand molecules will stick.

Much research has been carried out into methods of surface treatment for reducing the "amount of $H_2O$ released", and some of these methods have been put into practical use. These are generally methods in which the surface of the vacuum material is polished wherein an undesirable modified surface layer is removed either mechanically or chemically. Conversely, coating methods in which a film which has desirable properties is formed over the whole surface of the vacuum material are also in general use. Examples of such films include $Cr_2O_3$ films (chromium oxide films) obtained by oxidizing the surface of the material itself, Si films (silicon films and silicon oxide films), and TiN films (titanium nitride films) which are obtained by deposition from the outside, and BN films (boron nitride films) which are obtained by diffusion from within the material. $Cr_2O_3$ films have been disclosed in Japanese Unexamined Patent Applications (Kokai) H6-41629 and H6-116632, silicon oxide films have been disclosed in Japanese Unexamined Patent Application (Kokai) H4-337074 and BN films have been disclosed in Japanese Unexamined Patent Applications (Kokai) H7-62431 and H4-263011.

Conventional surface treatments, as described above, are all carried out to reduce the "amount of $H_2O$ released", and their effect has been evaluated just on the basis of the extent of the "amount of $H_2O$ released". The other factor, namely the "$H_2O$ sticking probability", has not been evaluated at all. This is mainly because it is very difficult to measure precisely the "$H_2O$ sticking probability", but it is also because it was thought generally that the two values were proportional, which is to say that the "$H_2O$ sticking probability" should also fall as a result of a surface treatment which reduces the "amount of $H_2O$ released".

An example of an investigation of surface treatment methods which measure the value of the "$H_2O$ sticking probability" precisely is found in Japanese Unexamined Patent Application (Kokai) H9-91606. According to that application, the "$H_2O$ sticking probability" is reduced by heating stainless steel in a specified atmosphere. However, care must be taken with handling the material after the treatment and, moreover, the values achieved are not satisfactory.

OBJECTS AND SUMMARY

An object of the present invention is to provide a practical method for the surface treatment of vacuum materials with which the "$H_2O$ sticking probability" is reduced satisfactorily.

The importance of the "$H_2O$ sticking probability" on the vacuum materials used in vacuum apparatus for thin film processing, for example, will be described first of all.

The main component of the residual gas in a vacuum apparatus before baking (heating while pumping out and de-gassing) is $H_2O$, and the pressure in the vacuum apparatus before baking is determined principally by the "amount of $H_2O$ released". However, when baking the vacuum apparatus, the $H_2O$ pressure falls by a few orders of magnitude. Hence, for a vacuum apparatus which has once been subjected to baking, the "amount of $H_2O$ released" becomes virtually insignificant. The latest vacuum apparatus for thin film processing purposes for the production of semiconductors and electronic parts is usually provided with a load-lock mechanism, and once baking has been carried out and the pressure has been reduced, the apparatus is operated continuously for a few weeks or even a few months while being maintained in a vacuum state. Thus, the effect of the "amount of $H_2O$ released" is only seen when the vacuum state has been broken for maintenance purposes and the system is put back into service after it has been exposed to atmospheric pressure.

On the other hand, even when baking has been carried out and the $H_2O$ pressure has been reduced, a large amount of $H_2O$ is released from the surface as a result of irradiation with energy beams or plasma, for example, and if the $H_2O$ pressure increases at such a time, then it is known that a very long period of time is required to return to the original pressure. The amount of $H_2O$ which is released at this time and the time taken to recover are determined mainly by the magnitude of the "$H_2O$ sticking probability". Thus, if the "$H_2O$ sticking probability" is high, then a large amount of $H_2O$ sticks to the wall, and the time taken for the $H_2O$ which has been released into the space to reach the exhaust port is also considerable. In such a case, the pumping efficiency is also poor. Now, energy beams and plasma are certainly generated in the film deposition operating state when cleanliness is essential in thin film processing. Hence, it is not the "amount of $H_2O$ released" but the "$H_2O$ sticking probability" which is the greatest problem in the thin film processing of semiconductor and electronic part production.

Accordingly, the method for the surface treatment of vacuum materials of this invention is intended to lower the $H_2O$ sticking probability on the surface of the vacuum material.

DETAILED DESCRIPTION OF THE PREFERRED EMBODIMENTS

Figure 1:
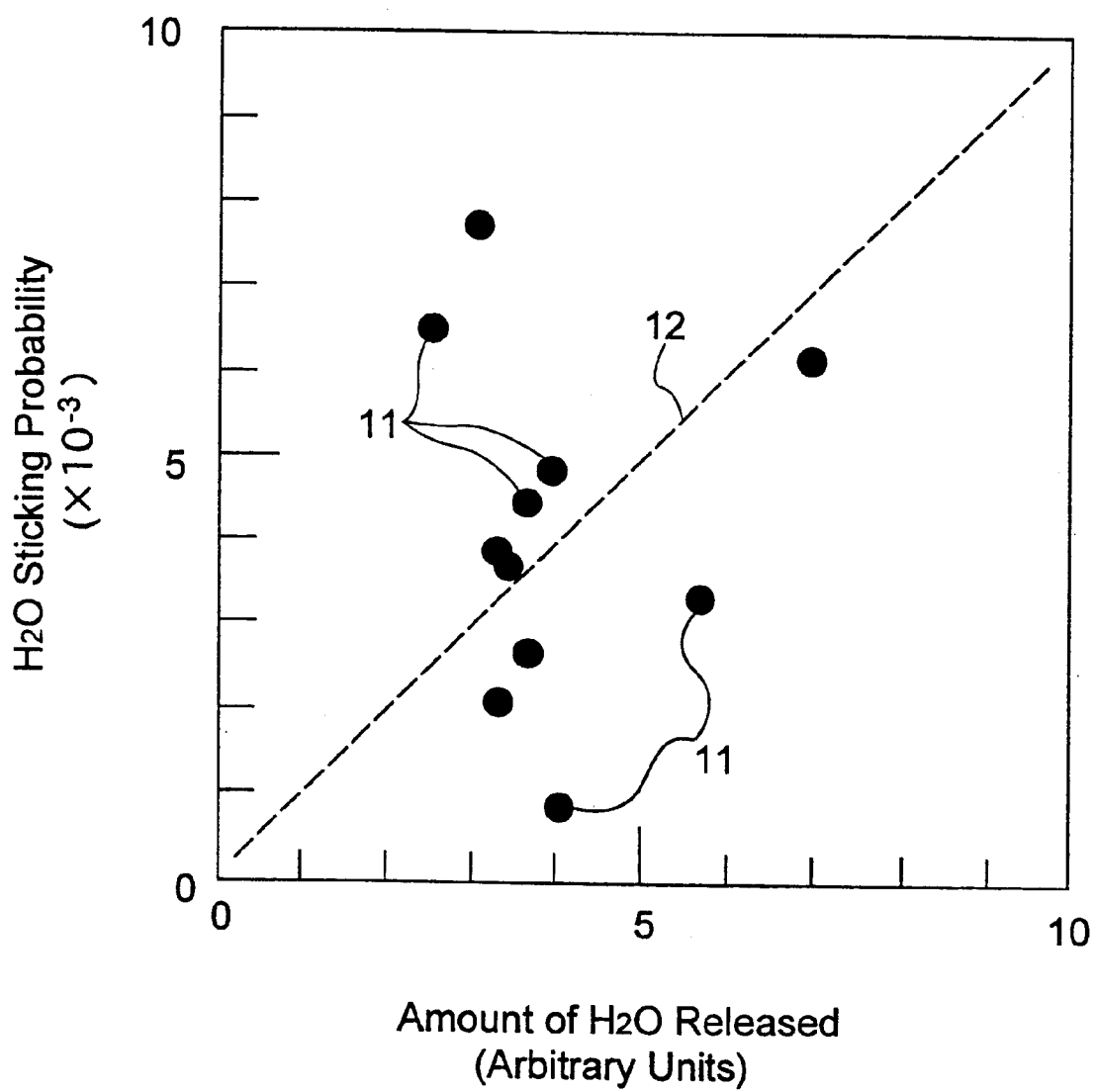
FIG. 1 is a chart which shows the relationship between the "amount of $H_2O$ released" and the "$H_2O$ sticking probability".

1. The Mechanism Behind the "$H_2O$ Sticking Probability"

As mentioned earlier, the importance of the "$H_2O$ sticking probability" has been investigated and the inventors have already disclosed a novel method for the precise measurement of the "$H_2O$ sticking probability" (Journal of Vacuum Science & Technology A, Vol. 16, No. 3, p. 1131 (1998)). The mechanism behind the "$H_2O$ sticking probability" on the surface of stainless steel, which is the most usual vacuum material, and methods of reducing the "$H_2O$ sticking probability" were both investigated using this disclosed method for measuring the "$H_2O$ sticking probability".

The mechanism behind the "$H_2O$ sticking probability" is thought to be as indicated below on the basis of the current state of research. The sites where gas sticks to (is adsorbed on) a solid surface are called adsorption sites, and in the simplest model these adsorption sites are directly above each of the atoms from which the surface is constructed. The density of these sites is around $10^{15}$ per $cm^2$. According to past research it has been confirmed that when a large amount of $H_2O$ is adsorbed, the number of $H_2O$ adsorption sites is also about $10^{15}$ is per $cm^2$. The state where a large amount of $H_2O$ has been adsorbed corresponds to a surface under atmospheric conditions and so this is the value for the adsorption sites which contribute to the "amount of $H_2O$ released". However, ultimately the "amount of $H_2O$ released" is related not to just the amount of water sticking to the outermost surface (the surface in direct contact with the space on the outside), but also to the strength of adsorption, the absorption and diffusion of water in the surface layer of the micron order (the region extending from the surface down to a certain depth), and the microform of the surface, for example. On this basis, the density of the adsorption sites is also the same when the amount adsorbed, corresponding to the "$H_2O$ sticking probability", is small, but it can be predicted that the intensity of the adsorption will be different.

Thus, according to research carried out by the inventors, the situation regarding the "$H_2O$ sticking probability" is shown in the first place to be fundamentally different from that regarding the "amount of $H_2O$ released". There are present, separate from the adsorption sites which contribute toward the "amount of $H_2O$ released" (referred to hereinafter as A sites), adsorption sites which have a lower density but a higher activity (referred to hereinafter as B sites). It is clear that the B sites contribute strongly to the "$H_2O$ sticking probability". Generally, the density of the B sites is of the order of $10^{12}$ per $cm^2$, that is, about 0.1% of the number of atoms forming the surface, but it varies from one to two orders of magnitude, depending on the composition and structure of the surface. Even though the B sites are at a lower density, they have a higher activity so there is a high probability that airborne $H_2O$ will stick to these sites. Consequently, the contribution of the A sites which, even though they are present at a high density, have a lower activity, is small, and the magnitude of the "$H_2O$ sticking probability" is determined by the density of the B sites. However, the contribution of the B sites to the "amount of $H_2O$ released", corresponding to a case where the amount adsorbed is high, is small since the density of the B sites is inevitably saturated.

The actual B sites are, for example, surface defects, and since the defect density generally differs greatly according to the state of the surface, there is also a corresponding marked difference in the "$H_2O$ sticking probability". Hence, a reduction of the defect density results in a reduction of the "$H_2O$ sticking probability". A reduction in the "$H_2O$ sticking probability" is realized by removing the porous oxide film which is present on the surface by heating under an ultra-high vacuum, as disclosed in Japanese Unexamined Patent Application (Kokai) H9-91606. The mechanism behind the "$H_2O$ sticking probability" is thought by the inventors to be as described above.

Next, in order to confirm in practice the relationship between the "amount of $H_2O$ released" and the "$H_2O$ sticking probability", the two values were measured for surfaces of stainless steels which had been subjected to various types of surface treatment which are being used industrially at the present time. The measured results are shown in FIG. 1. The "amount of $H_2O$ released" is shown on the abscissa of the graph shown in FIG. 1 and the "$H_2O$ sticking probability" is shown on the ordinate. If there is a proportionality between the "amount of $H_2O$ released" and the "$H_2O$ sticking probability", then the measured points 11 should be concentrated along the dotted line 12, but in practice there is a very wide spread showing that there is no correlation between the two values. This result supports the conclusions reached above. Furthermore, when seen from the viewpoint of surface treatment, the "amount of $H_2O$ released" and the "$H_2O$ sticking probability" are based on different phenomena, and it is shown clearly that they each require their individual countermeasure.

2. Reducing the "$H_2O$ Sticking Probability" by the Deposition of Silicon Oxide In the course of carrying out the measurements described above it was discovered that the "$H_2O$ sticking probability" is reduced on surfaces to which small amounts of C (carbon), S (sulphur) or Si (silicon, which is oxidized in practice and so it is really silicon oxide) and the like have become attached by chance. However, in these cases again there is no marked change in the "amount of $H_2O$ released".

Thus, as an example, trace amounts of silicon oxide were deposited on the surface of stainless steel, covering the surface, and the amount deposited was controlled to vary the coverage. The relationship between the silicon oxide coverage of the surface and the "H$_2$O sticking probability" was investigated. Here, "the silicon oxide coverage of the surface" signifies the percentage of the surface which is covered if the whole area of the stainless steel is taken to be 1. A coverage of 100% is a state where the whole surface is finally covered after starting to deposit the silicon oxide film. The chemical vapor deposition method (CVD method) was used preferably for depositing the silicon oxide. In terms of the deposition conditions, tetra-ethoxysilane was used as the source material and the stainless steel was heated to about 200 to 400° C., for example, in an atmosphere of tetra-ethoxysilane and oxygen. The abovementioned silicon oxide coverage was measured using XPS (photoelectron spectroscopy) which is a method of surface analysis (the details are described in the illustrative examples). The results obtained are shown in FIG. 2.

Figure 2:
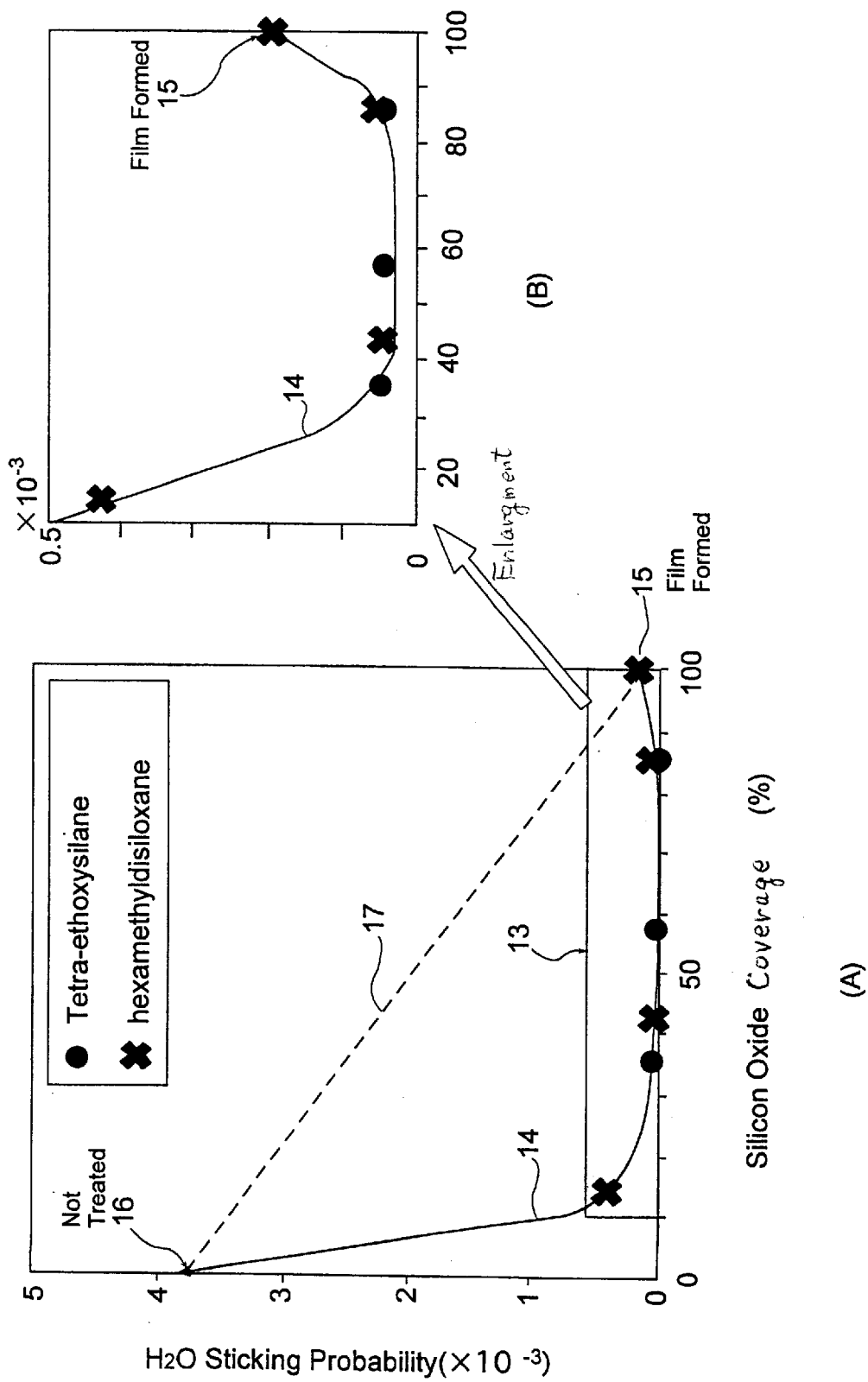
FIG. 2 is a chart which explains the silicon oxide coverage dependence of the "$H_2O$ sticking probability" obtained with the method of surface treatment of the invention.

Two graphs (A) and (B) are shown in FIG. 2, and graph (B) is an enlargement of the region 13 of graph (A). In graphs (A) and (B) in FIG. 2, the silicon oxide coverage is shown on the abscissa and the "H$_2$O sticking probability" is shown on the ordinate. The characteristic 14 shows the change in the "H$_2$O sticking probability" with respect to the silicon oxide coverage. The probability in the "film formed" state 15 (where the coverage is 100%), which is to say the "H$_2$O sticking probability" of silicon oxide itself, is lower than the "H$_2$O sticking probability" of the stainless steel itself in the "untreated" state 16 (where the coverage is 0%). If the silicon oxide is deposited uniformly (selectively) on the surface and the "H$_2$O sticking probability" is reduced only in the covered regions, then the "H$_2$O sticking probability" of the whole surface should be an average value of the area ratio of the covered part and the base stainless steel part. That is to say, the "H$_2$O sticking probability" between coverages of from 0 to 100% should lie on the dotted line 17 which joins the point 15 which represents the "film formed" state and the point 16 which represents the "untreated" state. However, the actual values are considerably below the dotted line 17. Moreover, it is also interesting that a value lower than the value for the "film formed" state 15 is seen at coverages of from 40 to 80%.

The phenomenon described above can be interpreted in the following way on the basis of the mechanism for the "H$_2$O sticking probability" conjectured above. At a coverage of less than 100%, the silicon oxide is not deposited uniformly on the surface but selectively on the abovementioned B sites which contribute to the "H$_2$O sticking probability". Since the B sites are active sites it is natural that the airborne silicon source material (tetra-ethoxysilane) will be deposited, grow and degrade with the B sites as nuclei. As a result, the B sites are inevitably embedded with inactive silicon oxide. Consequently, the "H$_2$O sticking probability" of the whole surface is greatly reduced with a coverage of less than 100% even though "film formation" has not been achieved.

Moreover, when a silicon oxide film is actually formed over the whole of the surface, then new defects are formed in the surface of this film. These defects again provide active sites and so the "H$_2$O sticking probability" inevitably rises again. Hence, B sites are deactivated by the deposition of the silicon oxide film and the lowest "H$_2$O sticking probability" is achieved at coverages of from 40 to 80% where no active sites are formed in the silicon oxide film.

Figure 3:
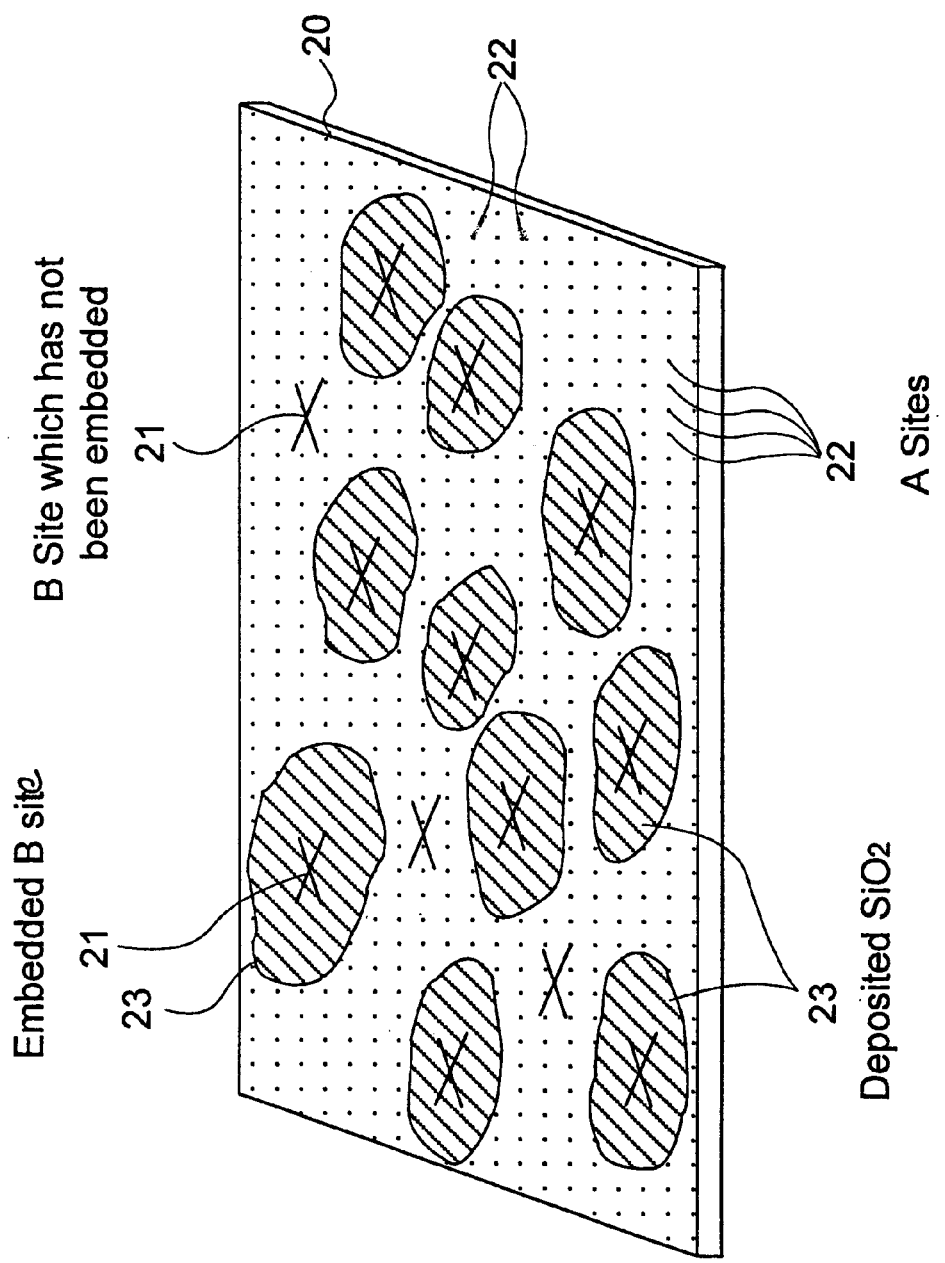
FIG. 3 is a drawing which shows, in essential outline, a model of a material surface on which silicon oxide has been deposited.

A diagram of the abovementioned model is shown in FIG. 3. Here 20 is the stainless steel vacuum material. In FIG. 3, the "X" marks 21 shown on the surface of the stainless steel 20 are the B sites which determine the "H$_2$O sticking probability" and the small dots 22 are the A sites which determine the "amount of H$_2$O released". The deposits 23 centered around the "X" marks are of silicon oxide (SiO$_x$). Most of the B sites are embedded with the silicon oxide 23 and are deactivated because they are covered with the silicon oxide 23. The A sites are not embedded but they are of lower activity and they are not associated with the "H$_2$O sticking probability". The B site density is about 0.1% of the A site density. Accordingly, at a coverage of 50%, about 500 molecules of silicon oxide have been deposited on each B site. Silicon oxide islands comprising such a number of molecules have grown from a single nucleus and so there are few surface defects. However, as the amount of silicon oxide deposited continues to rise, the islands grow and merge together to form a film over the whole surface and it is at this time that the number of defects increases with the merging surfaces as centers.

This can be illustrated in another way as follows. Cracks (corresponding to defects, B sites) are introduced into a concrete wall (corresponding to the surface). Dust (corresponding to H$_2$O) readily collects in these cracks. If the cracks are then embedded with a caulking material (corresponding to the silicon oxide), then it becomes difficult for dust to collect. However, if the whole wall surface is covered with the caulking material, then new cracks will form in the caulking material surface and dust will collect readily once again.

The lowering of the "H$_2$O sticking probability", due to the deposition of a trace amount of silicon oxide, can be understood in this way.

As indicated above, the method for the surface treatment of vacuum materials of this invention is a method in which the sticking probability of water on the surface of a vacuum material is reduced by depositing a specified material (preferably a substance which contains silicon), such as silicon oxide, at least on the regions which determine the "H$_2$O sticking probability" (the highly active B sites) on the surface of the vacuum material, covering the regions, but with a coverage of less than 100%. In other words, the silicon oxide, or like material, is deposited on the surface in such a way that the coverage is less than 100%, and preferably with a coverage of from 30 to 90%, and more preferably with a coverage of from 40 to 80%, as is clear from graph (A) in FIG. 2. It is possible with such a structure to reduce the "H$_2$O sticking probability" by some two orders of magnitude. Moreover, other merits (effects) are also realized on the basis of this general principle.

First of all, the method of surface treatment of the invention has a coverage of less than 100% and so when compared with film deposition there are advantages in terms of particles and gas release.

In other words, when depositing a film, and especially when it is being deposited from the outside, there is generally some concern about the strength of attachment with the base. Peeling of the film occurs naturally as a result of the stresses within the film itself, differences in thermal expansion coefficients, and deformation of the base, for example. Thus, the peeling of the film becomes a source of particles which are a serious problem when producing semiconductors and electronic parts. Moreover, there is also some concern about the denseness of the film. If the film is not dense enough, then not only is there an increase in the number of defects which increases the "H$_2$O sticking probability" but there is also a risk that the amount of gas released, namely the gas which has been absorbed and diffused in the film itself, will also be increased. In practice, according to a study of the reduction in the amount of gas released resulting from film deposition, it is reported that there is a marked difference in the amount of gas released depending on differences in the film deposition conditions even if the film composition is the same.

On the other hand, in the case of the method of surface treatment of the present invention, the amount of film deposited is only a trace amount, and the film is generally deposited only on the very active B sites. Accordingly, the problems with peeling and denseness are fundamentally avoided.

The method of surface treatment of the present invention is not in principle based on the inherent properties of stainless steel and silicon oxide but only in general on the nature of the "$H_2O$ sticking probability" on a solid surface and the nature of selective deposition of the source material. Hence, the method for the surface treatment of vacuum materials of the invention is not limited to specific materials but can be used with many materials. In fact, its effect has also been confirmed with carbon and sulphur on a stainless steel surface and with silicon oxide on an Al (aluminum) or Ti (titanium) surface.

EXAMPLES

Figure 4:
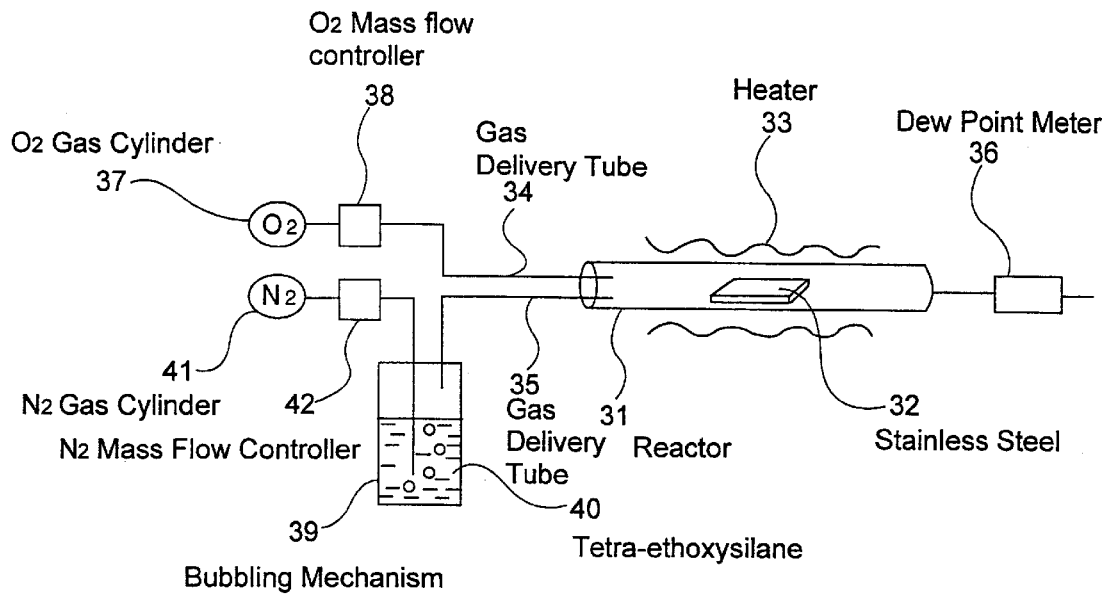
FIG. 4 is a drawing which shows a first embodiment of a processing apparatus for executing the method for the surface treatment of a vacuum material of the present invention.

A first embodiment of an apparatus for executing a method for the surface treatment of vacuum materials according to the present invention is shown in FIG. 4. A stainless steel vacuum material 32 is arranged in a generally tubular shaped reactor 31. A heater 33 is established on the outside of the reactor 31 and the reactor 31 and the stainless steel 32 are preferably heated to about 100 to 400° C. Gas delivery pipes 34 and 35 are connected to the left end of the reactor 31, and a dew-point meter 36 is established on the right end. Oxygen ($O_2$) gas is supplied to the gas delivery tube 34 via an $O_2$ mass flow controller 38 from an $O_2$ gas cylinder 37, and the $O_2$ gas is delivered into the reactor 31. The apparatus further includes a bubbling mechanism 39 and tetra-ethoxysilane 40 is housed in the container of the bubbling mechanism 39. Nitrogen ($N_2$) gas is supplied to the bubbling mechanism 39 via a source gas mass flow controller 42 from an $N_2$ gas cylinder 41. The left and of the abovementioned gas delivery tube 35 is inserted into the bubbling mechanism 39. By this means $N_2$ gas is introduced directly into the reactor and so it is possible to control the concentration of source gas within the reactor. The structure which introduces $N_2$ gas directly into the reactor and controls the source gas concentration is not an essential structure and it can be selected as required.

The stainless steel 32 which is to be surface treated is arranged in the reactor 31 and is heated with the heater 33. $N_2$ gas is discharged from the $N_2$ gas cylinder 41 under the control of the source gas flow rate controller 42. The $N_2$ gas passes through the liquid tetra-ethoxysilane 40 in the bubbling mechanism 39 in the form of bubbles to form a gas which contains tetra-ethoxysilane vapor, and this is delivered via the gas delivery tube 35 into the reactor 31. Furthermore, $O_2$ gas is discharged from the $O_2$ gas cylinder 37 under the control of the $O_2$ mass flow controller 38 and is delivered into the reactor 31 through the gas delivery tube 34. The gaseous mixture of tetra-ethoxysilane, $N_2$ gas, and $O_2$ gas passes over the surface of the heated stainless steel 32 in the reactor 31. At this time, the tetra-ethoxysilane is decomposed, and silicon oxide is deposited on the surface of the stainless steel 32. The gas expelled from the reactor 31 is monitored in terms of its humidity by means of the dew-point meter 36.

Figure 5:
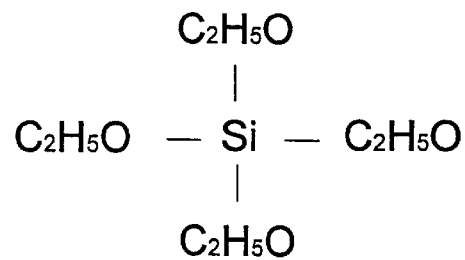
FIG. 5 is a drawing which shows the chemical formula of the tetra-ethoxysilane, which is the source material used in the first embodiment of the present invention.

The deposition method used above is generally known as the CVD method. Tetra-ethoxysilane is a type of organo-silicon compound and it is also known as tetraethyl-orthosilicate (TEOS). Its structure is shown in FIG. 5. The CVD method with tetra-ethoxysilane is used in semiconductor processing to deposit $SiO_2$ in the form of films from 100 to 1000 molecules thick. The conditions for this processing with tetra-ethoxysilane alone involve a temperature of at least 700° C. When $O_2$ is supplied at the same time, a temperature of about 620 to 680° C. is used. When $O_3$ (ozone) is delivered at the same time, a temperature of about 400° C., and a deposition rate of some 1 to 10 molecular layers per second is obtained.

On the other hand, in the method for the surface treatment of vacuum materials of this invention where the CVD method is used, selective deposition is required with deposition in amounts of less than a mono-molecular layer. That is to say, it is necessary to deposit silicon oxide on all of the B sites while not forming a film over the other parts so as to not form a complete film over the whole surface. Accordingly the processing conditions are set to a lower temperature for a longer period of time while supplying $O_2$ (oxygen) at the same time. In a preferred embodiment, the temperature is set to about 100 to 400° C., the $O_2$ mass flow rate is set to about 200 to 500 ml/minute, the mass flow rate of $N_2$ gas which contains the tetra-ethoxysilane vapor is set to about 10 to 20 ml/minute, and the processing time is set to about 1 to 10 minutes. Moreover, humidity is preferably maintained below a dew point of –50° C.

The conditions which should preferably be adhered to among these conditions are the minimum temperature (100° C.) and the maximum dew point (–50° C.). The tolerance range for the other values is large, and in fact, it makes no great difference if separate $N_2$ gas is supplied at the same time, or if the $O_2$ or tetra-ethoxysilane vapor concentrations are reduced by an order of magnitude. Furthermore, the processing time is shortened if the processing temperature is raised.

When carrying out an actual surface treatment, each flow rate and the temperature are set. After ensuring that the conditions in the reactor 31 are stable and the temperature is satisfactory, the stainless steel 32 is introduced into the reactor 31. This state is maintained and processing is completed with the passage of the prescribed period of time and then the stainless steel 32 is then taken out of the reactor 31. The stainless steel is not subjected to any particular pre-treatment or post-treatment, for example, other than the treatment indicated above. A sample of SUS304 of which the surface had been subjected to electrolytic polishing (EP) and cleaning was used for the stainless steel 32 in the embodiment shown in FIG. 4, but these are not essential conditions. In practice, experiments have been carried out with surfaces of SUS316L, and with surfaces which had been mechanically polished (buffed) and with surfaces on which an oxide film had been formed, and more or less the same results were obtained.

The surface treated stainless steel 32 was subjected to measurement of its "$H_2O$ sticking probability" and its silicon oxide coverage using XPS (photoelectron spectroscopy). The "$H_2O$ sticking probability" was measured as the percentage of sticking when the surface which had been cleaned in an ultra-high vacuum was doped with 0.5 Langmuir ($5 \times 10^{14}/cm^2$) of $H_2O$. In the XPS analysis the Ka line from an Al target was used as the light source and, by setting the discharge angle of the photoelectrons to 80° with respect to the normal, compositional analysis for a layer of from 1 to 2 atoms from the surface was obtained. The results are shown by the solid black circles in FIG. 2.

Embodiments (experimental examples) of the method of surface treatment of a vacuum material (stainless steel 32) in which the abovementioned tetra-ethoxysilane (TEOS) is used are indicated below in Table 1.

TABLE 1

| | A: Treatment Conditions | | | B: Embodiment | | | |
|---|---|---|---|---|---|---|---|
| Temp. °C. | TEOS Exposure torr·s | TEOS Conc. torr | $O_2$ Conc. torr | $N_2$ Carrier Gas Mass Flow SCCM (= cc/min) | $N_2$ Diluent Gas Mass Flow SCCM | $O_2$ Mass Flow SCCM | Treatment Time s (sec) |
| 150 | $10^3$–$10^4$ Level | $10^{-2}$–$10^{-1}$ Level | $10^2$ Level | 20 | 0 | 500 | $4 \times 10^4$ |
| 200 | $10^2$–$10^3$ Level | $10^{-3}$–$10^{-2}$ Level | $10^2$ Level | 20 | 2000 | 500 | $2.2 \times 10^4$ |
| 300 | $10^1$–$10^2$ Level | $10^{-3}$–$10^{-2}$ Level | $10^2$ Level | 20 | 1000 | 500 | $3.6 \times 10^3$ |
| 300 | $10^2$–$10^3$ level | $10^{-2}$–$10^{-1}$ Level | 0 | 50 | 500 | 0 | $3.6 \times 10^3$ |

Embodiments carried out with the common condition of dew point below −50° C. under the three temperature conditions of 150° C., 200° C. and 300° C. within the aforementioned temperature range from 100 to 400° C. are shown in Table 1. The details of the embodiments at each temperature are shown in column B on the right-hand side of Table 1. The embodiments are described in terms of the $N_2$ carrier gas mass flow, the $N_2$ diluent gas mass flow, the $O_2$ mass flow and the treatment time. The $N_2$ carrier gas passes through the bubbling mechanism 39 as described before and is delivered into the reactor 31 carrying TEOS vapor. Moreover 2/760 of the mass flow corresponds to the TEOS mass flow. Here in the proportion 2/760, the 760 of the denominator corresponds to the set pressure of the abovementioned carrier gas, which is to say atmospheric pressure (760 torr), and the 2 of the numerator corresponds to the saturated vapor pressure of the TEOS vapour (2 torr) resulting from the bubbling. Furthermore, in the embodiments $N_2$ diluent gas was delivered directly into the reactor by means of a diluent gas mass flow controller except when the treatment temperature was 150° C. The mass flow of gas is indicated in units of SCCM (ml(cc)/minute). In Table 1, the treatment conditions are described generally in column A on the left-hand side corresponding to each embodiment at each temperature. The treatment conditions are described in terms of the TEOS exposure (torr·s (sec)), the TEOS concentration (torr) and the $O_2$ concentration (torr). If the mass flow of $N_2$ carrier gas is "a", the mass flow of $N_2$ diluent gas is "b" and the mass flow Of $O_2$ is "c", then the TEOS concentration is obtained as $2a/(a+b+c)$ and the oxygen concentration is obtained as $760c/(a+b+c)$. The formula $2a/(a+b+c)$ is derived by multiplying the saturated vapor pressure 2 torr of the TEOS vapor by the dilution proportions $a/(a+b+c)$, and the formula $760c/(a+b+c)$ is derived by multiplying the oxygen pressure, 760 torr, by the dilution proportions $c/(a+b+C)$, and the TEOS concentrations and $O_2$ concentrations were obtained by means of these formulae. The TEOS exposure was obtained as the product of the TEOS concentration and the treatment time. The TEOS exposure corresponds to the total number of TEOS particles reaching the surface of the vacuum material per unit area in the treatment time while the TEOS concentration indicated in units of torr which indicate pressure corresponds to the number of TEOS particles per unit volume.

When the temperature was 300° C. in the abovementioned embodiments, surface treatment in accordance with the invention could be carried out without oxygen, as indicated in the lower level in Table 1, since the temperature was high.

Figure 6:
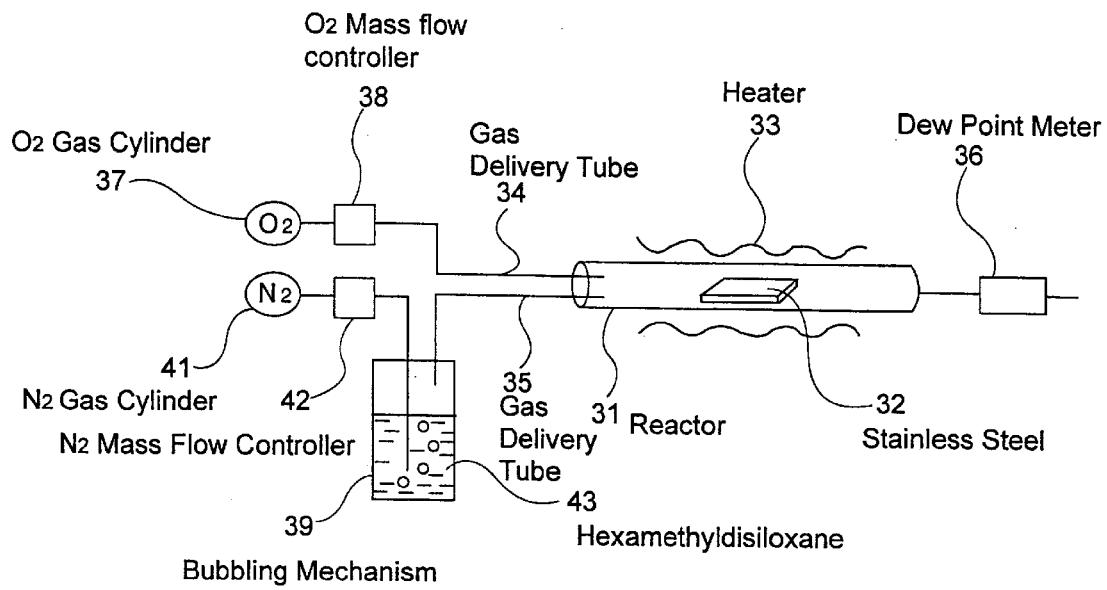
FIG. 6 is a drawing which shows a second embodiment of a processing apparatus for executing the method for the surface treatment of a vacuum material of the present invention.
Figure 7:
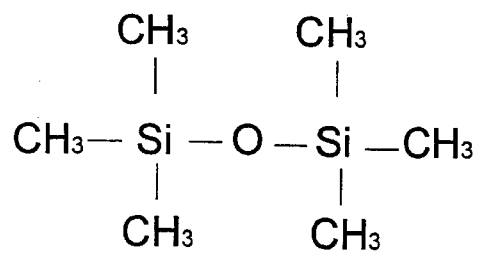
FIG. 7 is a drawing which shows the chemical formula of the hexamethyldisiloxane, which is the source material used in the first embodiment.

A second embodiment of the construction of an apparatus for executing the method of surface treatment of vacuum materials of the present invention is shown in FIG. 6. Parts which are essentially the same as parts described in FIG. 4 are indicated using the same reference numbers as in FIG. 4. The liquid 43 housed in the bubbling mechanism 39 is hexamethyldisiloxane. The construction apart from the change over from the tetra-ethoxysilane 40 described above to the hexamethyldisiloxane 43, is the same as in the first embodiment described in FIG. 4. The chemical formula for hexamethyldisiloxane 43 is shown in FIG. 7.

Hexamethyldisiloxane 43 is also a type of organo-silicon compound, and it is used in large quantities in silicone resins, silicone rubbers and silicone oils which are all polymers which contain Si and O. When compared with tetra-ethoxysilane, hexamethyidisiloxane requires a slightly higher processing temperature of at least 200° C., and a humidity of up to about −30° C. is permitted. It is thought that this is because tetra-ethoxysilane has a higher reactivity and inevitably reacts with $H_2O$ in the space, and decomposition and deposition on the surface is inhibited. $H_2O$ is generated from the stainless steel 32 and the reactor 31 during actual surface treatment and the temperature is liable to fall and so hexamethyldisiloxane is more useful from these points of view.

The conditions other than the temperature and humidity are preferably the same as in the first embodiment. In other words, the temperature is set to about 200 to 500° C., the $O_2$ mass flow rate is set to about 200 to 500 ml/minute, the mass flow rate of $N_2$ gas which contains hexamethyldisiloxane vapor is set to about 10 to 20 ml/minute, and the treatment time is set to about 1 to 10 minutes. Furthermore the humidity is maintained at a dew point below −30° C.

As with the first embodiment, the results obtained are shown by the "X" marks in FIG. 2.

According to FIG. 2, there was no great difference between the results with the first embodiment and the results with the second embodiment. In both cases the "$H_2O$ sticking probability" was greatly reduced when the silicon oxide coverage was from 40 to 80%. The "$H_2O$ sticking probability" at this time had a small value at about $10^{-5}$.

Embodiments (experimental examples) of the method of surface treatment of vacuum material (stainless steel 32)

using the abovementioned hexamethyldisiloxane (referred to hereinafter as siloxane) are shown below in Table 2.

TABLE 2

| | A: Treatment Conditions | | | | B: Embodiments | | | | |
| --- | --- | --- | --- | --- | --- | --- | --- | --- | --- |
| | | | | | $N_2$ Carrier | $N_2$ Diluent | | | |
| Temp. (° C.) | Siloxane Exposure torr · s | Siloxane Conc. torr | $O_2$ Conc. torr | After-oxidation | Gas Mass Flow SCCM | Gas Mass Flow SCCM | $O_2$ Mass Flow SCCM | Treatment Time s | After-Oxidation |
| 300 | $10^2$–$10^3$ level | $10^{-1}$–$10^0$ level | $10^2$ level | Yes | 10 | 0 | 700 | $3.6 \times 10^3$ | Yes |
| 300 | $10^3$–$10^4$ level | $10^0$–$10^1$ level | $10^2$ level | No | 10 | 0 | 200 | $3.6 \times 10^3$ | No |

Embodiments carried out under conditions of dew point below −30° C. at a temperature of 300° C. within the aforementioned temperature range from 200 to 500° C. are shown in Table 2. The details of the embodiments are shown in column B on the right-hand side of Table 2 in terms of the $N_2$ carrier gas mass flow, the $N_2$ diluent gas mass flow, the $O_2$ mass flow and the treatment time. The $N_2$ carrier gas passes through the bubbling mechanism 39 as described before and is delivered into the reactor 31 carrying siloxane vapor, and in this case the mass flow 55/760 corresponds to the siloxane mass flow. Here in the proportion 55/760, the 760 of the denominator is as described before and the 55 of the numerator corresponds to the saturated vapor pressure of the siloxane vapor (55 torr) resulting from the bubbling. Furthermore, in the embodiments the mass flow of $N_2$ diluent gas was set to 0, no diluent gas being used in this case. In Table 2 again the treatment conditions are described generally in column A on the left-hand side corresponding to each embodiment at each temperature. The treatment conditions are described in terms of the siloxane exposure (torr·s (sec)), the siloxane concentration (torr), the $O_2$ concentration (torr) and the treatment time. The siloxane concentration and the $O_2$ concentration were obtained in the ways described before, and the siloxane exposure was obtained as the product of the siloxane concentration and the treatment time. The significance of the exposure is the same as before.

Two cases, namely with after-oxidation (yes) and without after-oxidation (no), are described in the abovementioned embodiments. The conditions of the after-oxidation are, for example, $O_2$ concentration 760 torr, temperature conditions from 80 to 150° C. and treatment time from 0.5 to 2 hours. The after-oxidation is an oxidation treatment carried out with the vacuum material after subjecting said vacuum material to surface treatment. In an embodiment, oxidation is not carried out adequately when siloxane is used, and an after-oxidation is required.

The surface of the stainless steel 32 which had been subjected to the method of surface treatment of the invention also had excellent stability after processing. Baking conditions which should be avoided so as not to allow the "$H_2O$ sticking probability" to increase again have been indicated in Japanese Unexamined Patent Application (Kokai) H9-91606. In practice, baking is carried out for 50 hours under these conditions, i.e., at an $H_2O$ partial pressure of $5 \times 10^{-5}$ torr ($H_2$ not added) and a heating temperature of about 230° C. However, with a surface which has been surface-treated in accordance with the present invention there was virtually no change in the "$H_2O$ sticking probability". These baking conditions are quite harsh conditions and so no problem at all is anticipated with the stability in use.

As indicated above, by means of the present invention it is possible to execute a method for the surface treatment of vacuum materials which can in practice reduce the "$H_2O$ sticking probability" satisfactorily.

In the above embodiments, a method in which the source gas and the $O_2$ gas have been passed continuously at atmospheric pressure (normal pressure) has been used for bubbling, but other methods can be used. Thus, it is possible to make use of various types of liquid vaporizing apparatus, to use a reduced pressure or to carry out the treatment as a batch process. For example, when processing the inner surfaces of a vacuum chamber which is of a large size or has a complicated shape, the interior of the vacuum chamber can be temporarily set to a vacuum state and then source material vapor and $O_2$ gas can be introduced successively. When tetra-ethoxysilane in particular is being used, the processing temperature is low and so surface treatment in accordance with the invention can be carried out satisfactorily after the vacuum apparatus has been completed.

In the embodiments described above, either tetra-ethoxysilane or hexamethyldisiloxane was used for the source material but other organo-silicon compounds and silicon-based gases such as $SiH_4$ (silane), for example, can also be used. Moreover, source materials other than silicon, for example C (carbon) and S (sulphur) can also be used. Moreover, in cases where the presence of different elements is a problem, the same element (substance) as the material surface can also be used. Not only stainless steel but a variety of other materials such as Al (aluminum), Ti (titanium) and Cu (copper) can be used for the treated vacuum material.

The method used to deposit the specified substance is not limited to the CVD method and physical vapor deposition methods (PVD methods) and other liquid phase methods, for example, can also be used. Moreover, methods in which elements which are included within the material are precipitated out on the surface by heating can also be used.

Furthermore, in practice, the effect can be anticipated not only in a vacuum apparatus which is used in a vacuum state in practice as a vacuum apparatus but also with materials where a similar reduction in the $H_2O$ partial pressure is required in the vacuum state, such as the materials used in connection with highly pure gases for example.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A method for surface treating a vacuum material forming an interior surface of a vacuum deposition chamber, comprising depositing a substantially uniform distribution of a substance on the vacuum material so that less than 100% of the vacuum material on which the distribution is made is covered by the substance so that an $H_2O$ sticking probability of the vacuum material is reduced, wherein substantially all active sites are covered by the deposited distribution but without forming a continuous film.

2. The method of claim 1, wherein the active sites are surface defects on the vacuum material.

3. The method of claim 1, wherein the substance contains silicon.

4. The method of claim 1, wherein the substance is silicon oxide.

5. The method of claim 1, wherein the vacuum material is stainless steel.

6. The method of claim 1, wherein the depositing is done using a CVD method.

7. The method of claim 6, wherein the CVD method uses an organo-silicon compound.

8. The method of claim 7, wherein the organo-silicon compound is tetra-ethoxysilane.

9. The method of claim 8, wherein the treatment temperature is from 100 to 400° C., and the dew point is not more than −50° C.

10. The method of claim 9, wherein, when oxygen is included as the atmosphere and the aforementioned treatment temperature is about 150° C., the tetra-ethoxysilane exposure is from $10^3$ to $10^4$ torr·sec, the tetra-ethoxysilane concentration is from $10^{-2}$ to $10^{-1}$ torr and the oxygen concentration is $10^2$ torr.

11. The method of claim 9, wherein, when oxygen is included as the atmosphere and the aforementioned treatment temperature is about 200° C., the tetra-ethoxysilane exposure is from $10^2$ to $10^3$ torr·sec, the tetra-ethoxysilane concentration is from $10^{-3}$ to $10^{-2}$ torr and the oxygen concentration is $10^2$ torr.

12. The method of claim 9, wherein, when oxygen is included as the atmosphere and the aforementioned treatment temperature is about 300° C., the tetra-ethoxysilane exposure is from $10^1$ to $10^2$ torr·sec, the tetra-ethoxysilane concentration is from $10^{-3}$ to $10^{-2}$ torr and the oxygen concentration is $10^2$ torr.

13. The method of claim 9, wherein, when oxygen is not included as the atmosphere and the aforementioned treatment temperature is about 300° C., the tetra-ethoxysilane exposure rate is from $10^2$ to $10^3$ torr·sec and the tetra-ethoxysilane concentration is from $10^{-2}$ to $10^{-1}$ torr.

14. The method of claim 8, wherein the CVD method uses oxygen in the atmosphere and the CVD method is carried out in a temperature range of 100 to 400° C., and the dew point is not more than −50° C.

15. The method of claim 7, wherein the organo-silicon compound is hexa-methyldisiloxane.

16. The method of claim 15, wherein the CVD method uses oxygen in the atmosphere and the CVD method is carried out in a temperature range of 200 to 500° C., and the dew point is not more than −30° C.

17. The method of claim 16, wherein, when the aforementioned treatment temperature is about 300° C., the hexamethyldisiloxane exposure is from $10^2$ to $10^3$ torr·sec, the hexamethyldisiloxane concentration is from $10^{-1}$ to $10^0$ torr and the oxygen concentration is $10^2$ torr, and an after-oxidation is carried out.

18. The method of claim 16, wherein, when the aforementioned treatment temperature is about 300° C., the hexamethyldisiloxane exposure is from $10^3$ to $10^4$ torr·sec, the hexamethyldisiloxane concentration is from $10^0$ to $10^1$ torr and the oxygen concentration is $10^2$ torr, and no after-oxidation is carried out.

19. The method of claim 1, wherein the distribution is generally no greater than a single molecular layer.

20. A method for surface treating a vacuum material forming an interior surface of a vacuum deposition chamber, comprising depositing a substantially uniform distribution of a substance on the vacuum material so that less than 100% of the vacuum material on which the distribution is made is covered by the substance so that an $H_2O$ sticking probability of the vacuum material is reduced; wherein the depositing step includes depositing the substance on only 40 to 80% of the surface.

21. The method of claim 1, wherein the substance contains silicon.

22. The method of claim 20, wherein the vacuum material is stainless steel.

23. The method of claim 20, wherein the depositing is done using a CVD method.

24. The method of claim 23, wherein the CVD method uses an organo-silicon compound.

* * * * *